(12) United States Patent
Chi

(10) Patent No.: US 7,965,566 B2
(45) Date of Patent: Jun. 21, 2011

(54) CIRCUIT AND METHOD FOR CONTROLLING LOCAL DATA LINE IN SEMICONDUCTOR MEMORY DEVICE

(75) Inventor: Sung-Soo Chi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 229 days.

(21) Appl. No.: 12/344,062

(22) Filed: Dec. 24, 2008

(65) Prior Publication Data

US 2009/0168560 A1 Jul. 2, 2009

(30) Foreign Application Priority Data

Dec. 28, 2007 (KR) ........................ 10-2007-0140413

(51) Int. Cl.
*G11C 7/00* (2006.01)
(52) U.S. Cl. ............ 365/189.17; 365/189.011; 365/205; 365/230.03
(58) Field of Classification Search ............. 365/189.17, 365/189.011, 205, 207, 190–191, 230.03
See application file for complete search history.

(56) References Cited

U.S. PATENT DOCUMENTS

| 5,598,341 A | 1/1997 | Ling et al. |
| 6,906,972 B2 * | 6/2005 | Proell et al. ............ 365/203 |
| 6,956,780 B2 * | 10/2005 | Kyung ...................... 365/205 |

FOREIGN PATENT DOCUMENTS

| JP | 10-107097 | 4/1998 |
| JP | 2001-101896 | 4/2001 |
| KR | 1020050106858 A | 11/2005 |
| KR | 1020060025776 A | 3/2006 |

OTHER PUBLICATIONS

Notice of Allowance issued from Korean Intellectual Property Office on Aug. 24, 2009 with an English Translation.

* cited by examiner

*Primary Examiner* — David Lam
(74) *Attorney, Agent, or Firm* — IP & T Group LLP

(57) ABSTRACT

The present invention relates to a semiconductor memory device, and more particularly, to a circuit and method for controlling local data lines, which can reduce loading on local data lines LIO. The circuit and method for controlling local data lines in accordance with the present invention is characterized by having different line loading of local data lines depending on positions of cell mats. In addition, local data lines between arrays are connected by a switch. Accordingly, the switch is turned on/off by address information about cell mat arrays, thereby preventing unnecessary line loading of local data lines to completely remove unnecessary loading. Moreover, the present invention reduces line loading, thereby improving data processing speed.

9 Claims, 5 Drawing Sheets

US 7,965,566 B2

CIRCUIT AND METHOD FOR CONTROLLING LOCAL DATA LINE IN SEMICONDUCTOR MEMORY DEVICE

CROSS-REFERENCE TO RELATED APPLICATIONS

The present invention claims priority of Korean patent application number 10-2007-0140413, filed on Dec. 28, 2007, which is incorporated by reference in its entirety.

BACKGROUND OF THE INVENTION

The present invention relates to a semiconductor memory device, and more particularly, to a circuit and method for controlling local data lines, which can reduce loading on the local data lines.

There is a need for a circuit for data transmission between a global data line GIO and a local data line LIO. The local data line receives an output from a bit line sense amplifier which is provided from the inside of a memory cell region. The global data line is an input/output data line for data transmission between a data input/output pad and the memory cell region. To this end, an input/output sense amplifier IOSA is used to transmit data loaded on the LIO line to the GIO line during a read operation.

In addition, a memory cell array has a matrix form which consists of a plurality of rows that often calls word lines and a plurality of columns that often calls bit lines. A predetermined address is assigned to each of the rows and columns, wherein a row address is used to designate a particular row and a column address is used to designate a particular column.

FIG. 1 shows the arrangement of a local data line in a conventional memory device. FIG. 2 is a conventional circuit diagram for controlling local data lines.

As shown in FIG. 2, the local data line LIO serves to transfer cell data to a bit line BL selected when a transistor MN4 is turned on by a bit line selection signal BISH. Also, the local data line LIO serves to transfer the data on the bit line BL to a segment input/output line SIO when a transistor MN3 is turned on by a control signal YS in response to a read address.

When a transistor MN1 is turned on by a line switch control signal IOSW, the data on the segment input/output line SIO is then transferred to the local data line LIO. Next, the data on the local data line LIO is amplified by an input/output sense amplifier IOSA and then fed to the global line GIO.

In the arrangement of such conventional local data line, X direction is determined by an active command when a semiconductor memory device is operated, and a row address enable signal ROW ADDRESS EN is activated by the active command and bank information. The activated row address enable signal is utilized to select a corresponding mat array in an X axis direction by logic operation of a row address.

The conventional local data lines with the configuration as above are composed of 128 lines depending on the type of the semiconductor memory device. The local data lines have a capacitance of about 350-770 fF for a semiconductor memory device of 1 Gbyte.

That is, a corresponding word line out of X axis directional mat is activated by an active command and then a line switch control signal IOSW is activated to establish a short-circuit between the segment input/output line SIO and the local data line LIO.

A sense amplifier 10 or 20 amplifies corresponding cell data and waits for a read command. Based on the read command and column address information, a control signal YS is determined. Based on the control signal YS, data of the sense amplifier 10 or 20 out of a sense amplifier array is loaded on the segment input/output line SIO to be transferred. A charge on the segment input/output line SIO is shared with the bit line. Therefore, the data loaded on the segment input/output line SIO is transferred to the local data line LIO connected by the IOSW.

In the meantime, a series of processes as below are performed until the data amplified by the sense amplifier 10 or 20 is transferred to the local data line LIO by the control signal YS.

A bit line BL has a capacitance of about 70 fF. The charge stored in the capacitance is charge shared to be equal to a sum of capacitance of the segment input/output line SIO and capacitance of the local data line LIO.

Meanwhile, the semiconductor memory device is provided with an input/output sense amplifier IOSA. Data transferred to the local data line LIO from the sense amplifier is again amplified and outputted to the global data line GIO. The input/output sense amplifier requires voltage (delta-V) within a certain range. In general, the input/output sense amplifier requires a voltage of 250 mV or more.

Therefore, as the local data line LIO is long in length, a large amount of charge should be derived from the bit line BL and a voltage obtained also becomes small for the same amount of charge. Thus, the decrease in line loading on the local data line will decrease current consumption and improve data processing speed.

In the conventional structure of local data line, however, line loading on the local data line is maintained constantly, regardless of where cell mat is. This structure causes unnecessarily excessive loading on data closer to the input/output sense amplifier, which leads to unnecessary reduction in characteristics.

SUMMARY OF THE INVENTION

Embodiments of the present invention are directed to providing a circuit and method for controlling local data lines in a semiconductor memory device, which can reduce loading on the local data lines and current consumption and also improve data processing speed.

To accomplish the above objective, the circuit and method for controlling local data lines in accordance with the present invention is characterized by having different line loading of local data lines depending on positions of cell mats. In addition, local data lines between arrays are connected by a transistor. Accordingly, the transistor that is turned on/off by address information about cell mat arrays prevents unnecessary line loading of local data lines to completely remove unnecessary loading. Moreover, the present invention reduces line loading, thereby improving speed.

In accordance with an aspect of the present invention, there is provided a circuit for controlling local data lines in a semiconductor memory device, which includes a bit line transferring data; local data lines which are provided depending on cell mat arrays, receive data on the bit line via a segment input/output line, and transfers the data to an input/output sense amplifier; a first switch for transferring the data on the segment input/output line to the local data lines; and a second switch for connecting the local data lines which are provided between cell mat arrays.

In accordance with another aspect of the present invention, there is provided a method for controlling local data lines in a semiconductor memory device which includes activating a word line corresponding to an active command; and when a line switch control signal for selecting one of local data lines is activated, connecting a segment input/output line and the selected local data line, and controlling the local data lines which are provided depending on cell mat arrays so that they variably operate based on a cell mat array being accessed.

DESCRIPTION OF SPECIFIC EMBODIMENTS

Hereinafter, a circuit and method for controlling local data lines in a semiconductor memory device in accordance with the present invention will be described in detail with reference to the accompanying drawings.

Figure 1:
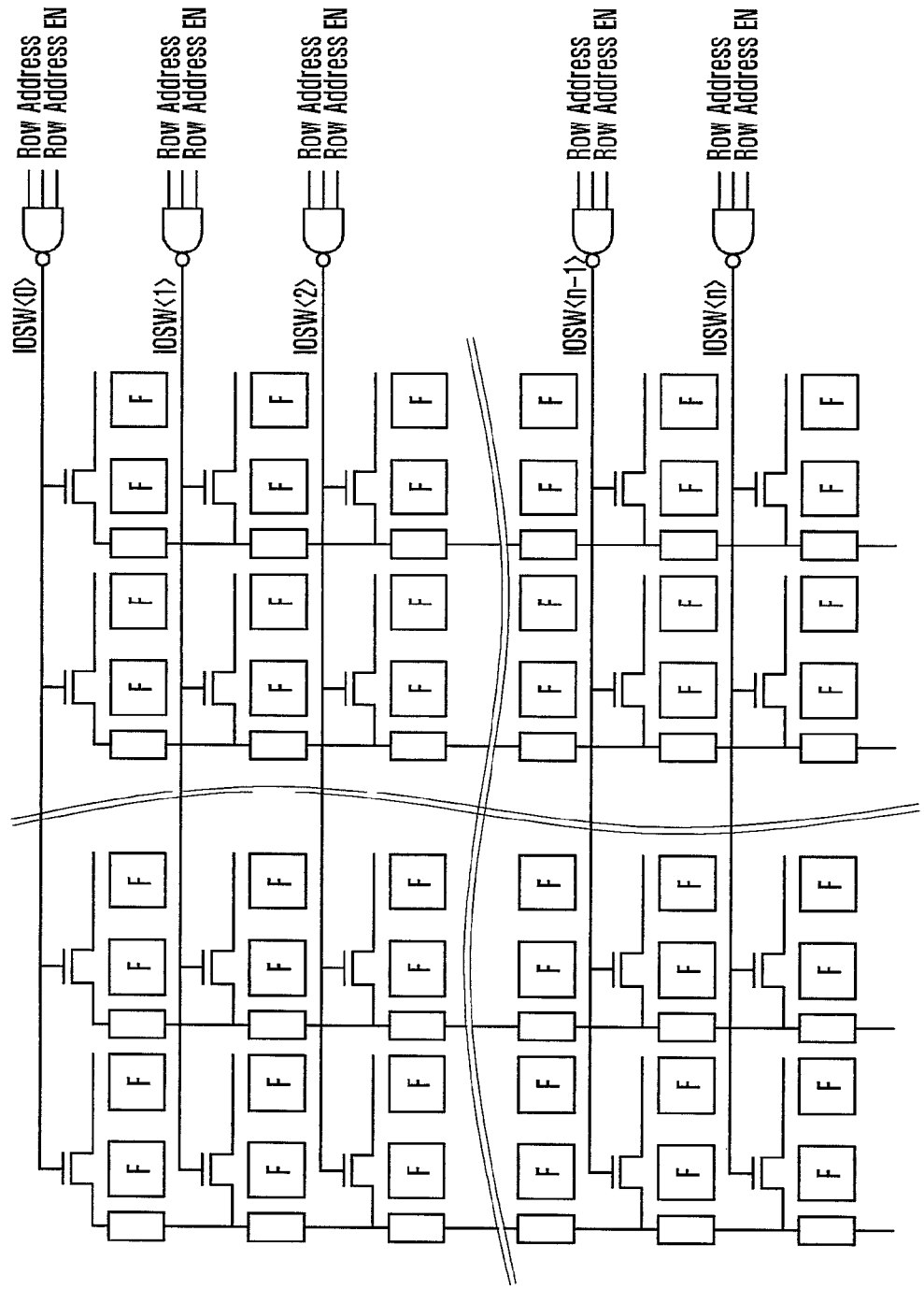
FIG. 1 shows the arrangement of a local data line in a conventional memory device.
Figure 2:
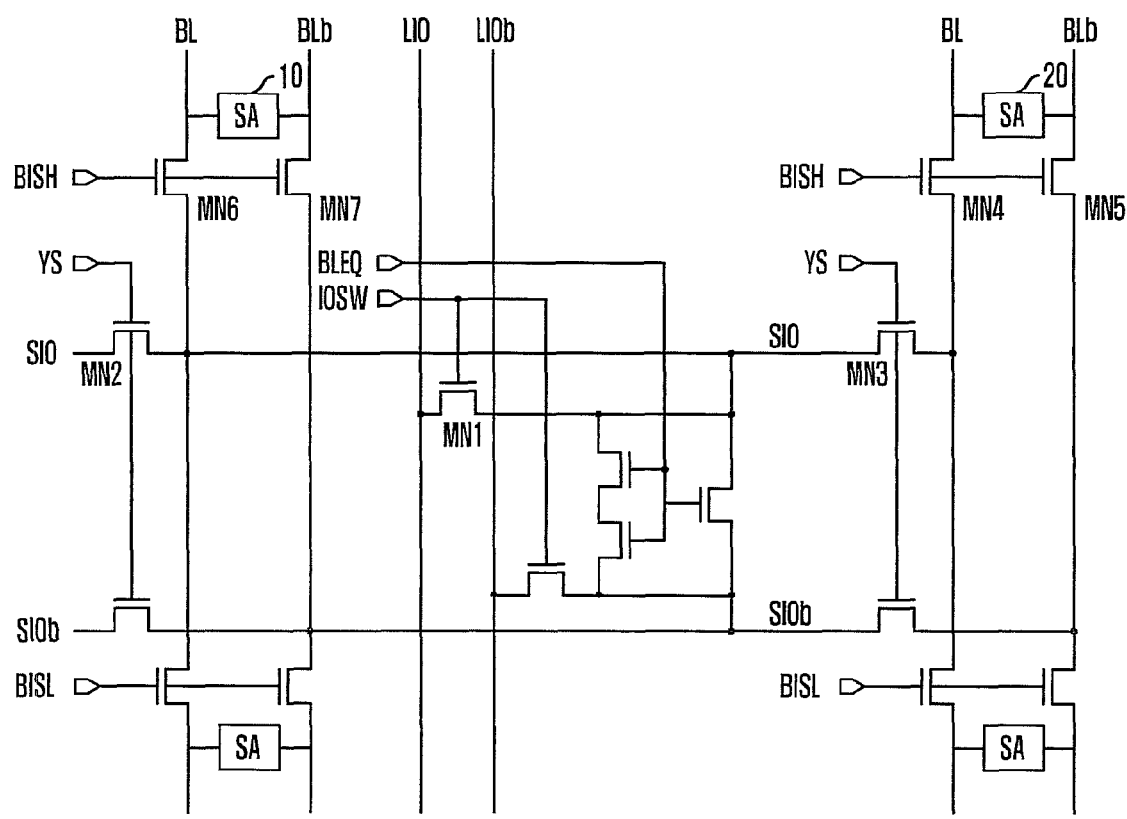
FIG. 2 is a diagram showing a conventional circuit for controlling local data lines.
Figure 3:
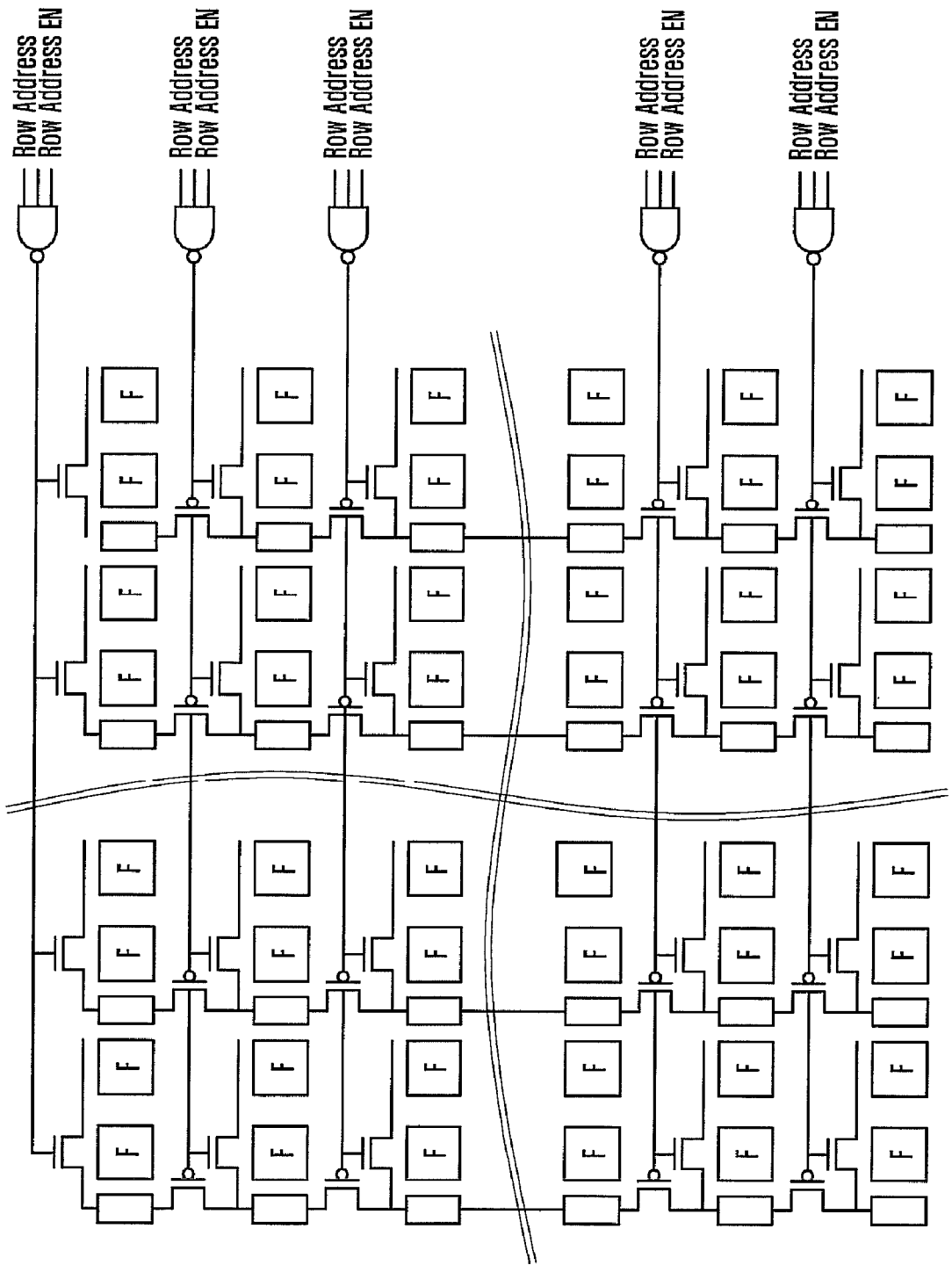
FIG. 3 schematically shows the arrangement of local data lines in a memory device in accordance with the present invention.
Figure 4:
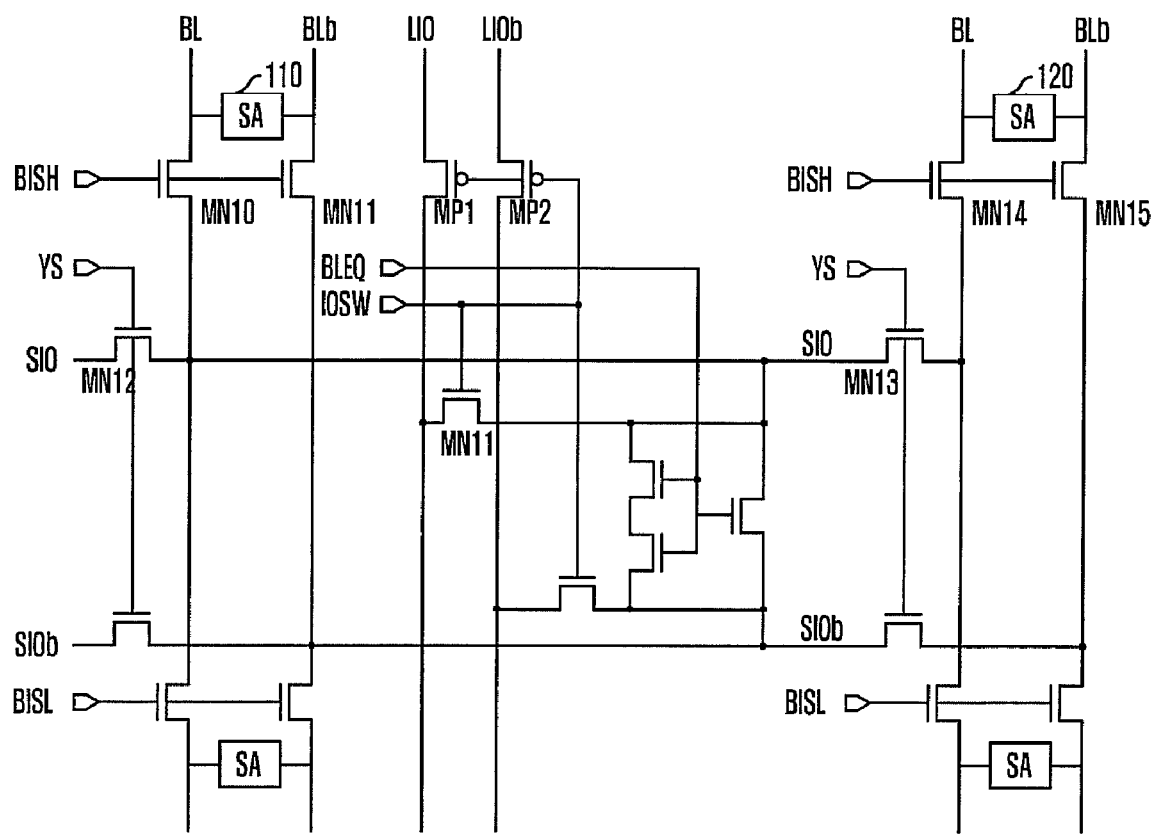
FIG. 4 is a diagram showing a circuit for controlling local data lines in accordance with the present invention.

FIG. 3 schematically shows the arrangement of local data lines in a memory device in accordance with the present invention. FIG. 4 is a circuit diagram for controlling local data lines in accordance with the present invention.

As shown in FIGS. 3 and 4, local data lines LIO serve to transfer cell data to a bit line BL selected when a transistor MN14 is turned on by bit line selection signals BISH and BISL. The local data lines LIO serve to transfer the data on the bit line to a segment input/output line SIO, when a transistor MN13 is turned on by a control signal YS in response to a read address. Then, when a transistor MN11 is turned on by a line switch control signal IOSW, the data on the SIO is transferred to the connected local data line LIO. The line switch control signal IOSW is a signal for controlling the connection between the local data lines LIO and plural SIO lines. The transistor MN11 is disposed between the local data lines LIO and the SIO lines. The transistor MN13 is disposed between the respective local data lines LIO corresponding cell mat arrays. Next, the data on the local data line is amplified by an input/output sense amplifier IOSA and then fed to the global line GIO.

The local data lines LIO are provided for each cell mat array. The local data lines corresponding to cell mat arrays are connected by a switch as a PMOS transistor MP1. The PMOS transistor MP1 is configured in a manner that it is turned on by a line switch control signal IOSW for controlling the connection between the local data lines LIO and plural SIO lines. That is, turning on of the transistor MP1 controls the local data line LIO so that it has different line loading depending on a location of cell mat array. In other words, when a certain array operates, the transistor serves to prevent loading of a local data line that corresponds to an upper or lower portion of the array that operates.

In the arrangement of the local data line as configured above, X direction is determined by an active command when a semiconductor memory device is operated, and a row address enable signal, ROW ADDRESS EN, is activated by the active command and bank information. The activated row address enable signal is used to select a corresponding mat array in an X axis direction by a logic operation of a row address.

That is, a corresponding word line out of X axis directional mat is activated in response to the active command. Then, a line switch control signal IOSW for controlling the connection between the local data lines LIO and plural SIO lines is activated to connect the segment input/output line SIO to only the selected local data line LIO. At this time, all other local data lines are not connected to the segment input/output line SIO. The line switch control signal IOSW in activation state causes the PMOS transistor MP1 connected to the local data line LIO to be turned off. This makes no line loading on a local data line that corresponds to an upper portion of the PMOS transistor MP1. PMOS transistors related to an access operation of another cell mat array that is connected to the local data line, except for the PMOS transistor MP1, which is in off state, are all in on state by a line switch control signal in inactivation state. Therefore, upper local data lines or lower local data lines are connected by the PMOS transistor MP1, which is in off state. That is, unnecessary line loading on local data lines is removed by the PMOS transistor MP1, which operates based on address information on the cell mat address.

The sense amplifier 110 or 120 amplifies corresponding cell data and waits for a read command. Based on the read command and column address information, a control signal YS is determined. Based on the control signal YS, data of the sense amplifier 110 or 120 out of the sense amplifier array is loaded on the segment input/output line SIO to be transferred. A charge on the segment input/output line SIO is shared with the bit line. Therefore, the data loaded on the segment input/output line SIO is transferred to the local data line LIO connected by the IOSW.

Thus, a series of processes as below are performed until the data amplified by the sense amplifier 110 or 120 is transferred to the local data line by the control signal YS.

When the control signal YS determined based on the read command and column address information is activated, the transistor MN12 is turned on and then data is transferred from the bit line BL to the segment input/output line SIO in charge manner. At this time, the bit line BL has a capacitance of about 70 fF. The charge stored in the capacitance is charge shared to be equal to a sum of capacitance of the segment input/output line, SIO, and capacitance of the local data line, LIO.

Meanwhile, the semiconductor memory device is provided with an input/output sense amplifier IOSA. Data provided to the local data line LIO from the sense amplifier is again amplified and outputted to the global data line GIO. At this time, the input/output sense amplifier also requires voltage (delta-V) within a certain range. In general, the input/output sense amplifier requires a voltage of 250 mV or more.

Figure 5:
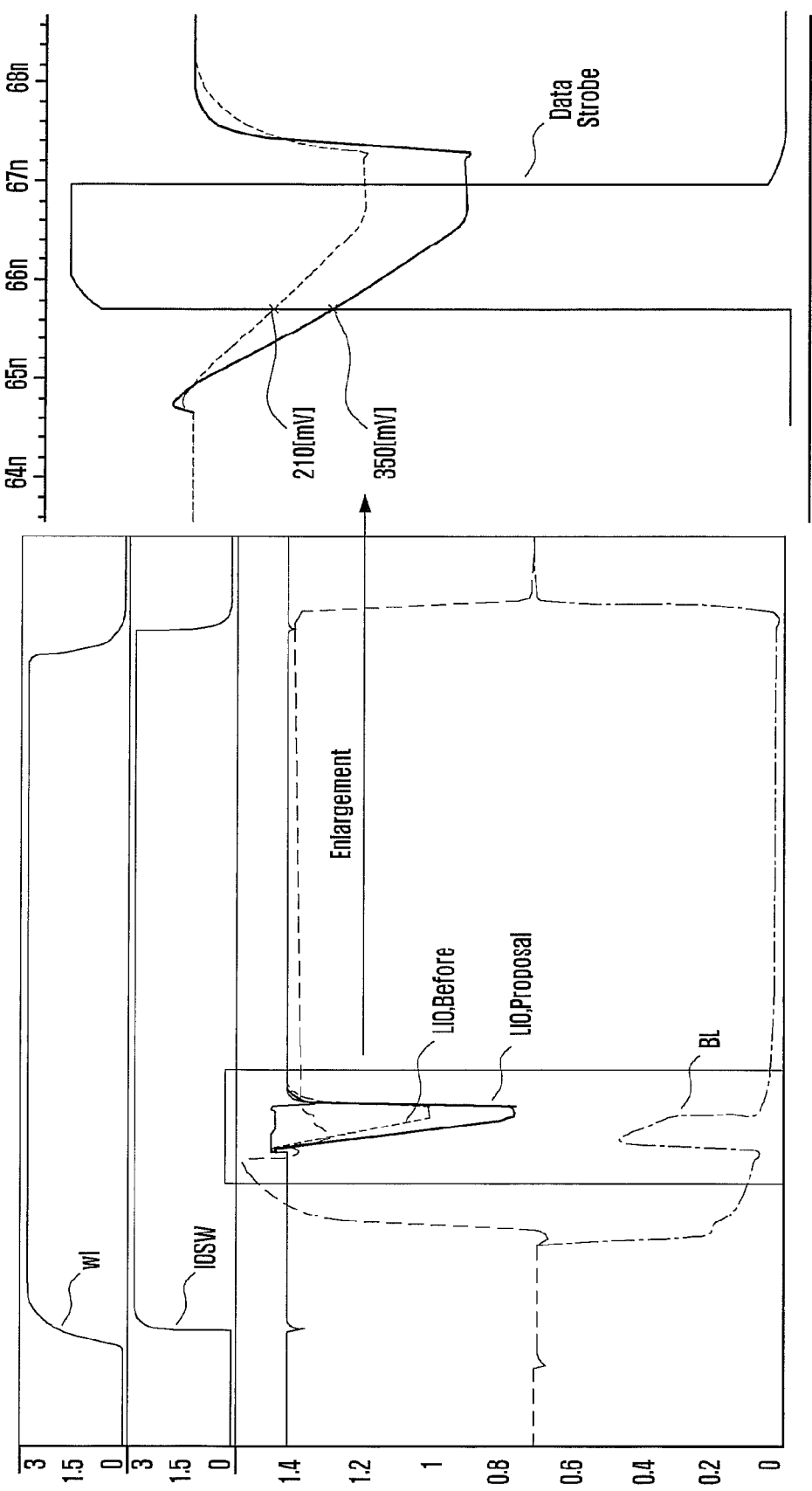
FIG. 5 is a waveform diagram showing a simulation result of an operation in accordance with the present invention.

That is, when a data strobe amplifies the data loaded on the local data line LIO, it has a delta voltage of 250 mV. When the data strobe is activated, a delta voltage between the local data line LIO and local data line bar LIOb is shown in FIG. 5. As shown in FIG. 5, the conventional case is about 210 mV, while the present invention maintains about 350 mV, which has a higher value than 250 mV required by the input/output sense amplifier.

As described above, although the preferred embodiment of the present invention is provided by way of example, the present invention can also be applied to a case where loading of the local data line is variably operated depending on a position of cell mat being accessed.

As a result, the circuit and method for controlling local data lines in accordance with the present invention is characterized by having different line loading of local data lines depending on positions of cell mats. In addition, local data lines between arrays are connected by a transistor. Accordingly, the transistor is turned on/off by address information about cell mat arrays, thereby preventing unnecessary line loading of local data lines to completely remove unnecessary loading. Moreover, the present invention reduces line loading, thereby improving data processing speed.

While the present invention has been described with respect to the specific embodiments, it will be apparent to those skilled in the art that various changes and modifications may be made without departing from the spirit and scope of the invention as defined in the following claims.

What is claimed is:

1. A circuit for controlling local data lines in a semiconductor memory device, comprising:
    a bit line for transferring data;
    local data lines which are provided depending on cell matrix arrays, for receiving data on the bit line via a segment input/output line, and transferring the data to an input/output sense amplifier;
    a first switch disposed between the segment input/output line and the local data lines, for transferring the data on the segment input/output line to the local data lines; and
    a second switch disposed between the respective local data lines, for connecting the local data lines which are provided between cell matrix arrays,
    wherein the first and second switches are controlled by the same signal, but have an opposite operation state to each other.

2. The circuit as recited in claim 1, wherein the signal for controlling the second switch is a line switch control signal for selecting one of the local data lines.

3. The circuit as recited in claim 2, wherein when the line switch control signal is in an activation state, line loading of a local data line above or below the second switch is removed.

4. The circuit as recited in claim 3, wherein the second switch is composed of a PMOS transistor.

5. The circuit as recited in claim 4, wherein the first switch is composed of an NMOS transistor.

6. The circuit as recited in claim 1, wherein the data on the bit line is switched by address information corresponding to a command, and transferred to the segment input/output line.

7. A method for controlling local data lines in a semiconductor memory device, comprising:
    activating a word line corresponding to an active command; and
    when a line switch control signal for selecting one of local data lines is activated, connecting a segment input/output line and the selected local data line, and controlling the local data lines which are provided depending on cell matrix arrays so that they variably operate based on a cell matrix array being accessed,
    wherein when the line switch control signal is in an activation state, line loading of a local data line above or below the cell matrix array being accessed is removed.

8. The method as recited in claim 7, further comprising:
    switching data on a bit line by address information corresponding to a command and transferring the data to the segment input/output line.

9. The method as recited in claim 8, further comprising:
    transferring the data on transferred to the segment input/output line in said transferring the data to an input/output sense amplifier through the local data line.

* * * * *